United States Patent
Kwon et al.

(10) Patent No.: US 10,503,066 B2
(45) Date of Patent: *Dec. 10, 2019

(54) PHOTOSENSITIVE RESIN COMPOSITION, BLACK PIXEL DEFINING LAYER USING THE SAME AND DISPLAY DEVICE

(71) Applicant: SAMSUNG SDI CO., LTD., Yongin-si, Gyeonggi-do (KR)

(72) Inventors: Jiyun Kwon, Suwon-si (KR); Jinhee Kang, Suwon-si (KR); Heekyoung Kang, Suwon-si (KR); Chang-Hyun Kwon, Suwon-si (KR); Sang Soo Kim, Suwon-si (KR); Chanwoo Kim, Suwon-si (KR); Bumjin Lee, Suwon-si (KR); Junho Lee, Suwon-si (KR); Chungbeum Hong, Suwon-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/459,328

(22) Filed: Mar. 15, 2017

(65) Prior Publication Data

US 2018/0088465 A1   Mar. 29, 2018

(30) Foreign Application Priority Data

Sep. 26, 2016   (KR) .......................... 10-2016-0123228

(51) Int. Cl.
*G03F 7/037* (2006.01)
*G03F 7/031* (2006.01)
(Continued)

(52) U.S. Cl.
CPC ........... *G03F 7/037* (2013.01); *C08G 73/105* (2013.01); *C08G 73/1039* (2013.01);
(Continued)

(58) Field of Classification Search
None
See application file for complete search history.

(56) References Cited

U.S. PATENT DOCUMENTS

| | | | | |
|---|---|---|---|---|
| 6,398,370 B1 * | 6/2002 | Chiu | ....................... | G02B 5/003 359/601 |
| 7,968,621 B2 * | 6/2011 | Oyanagi | .............. | C09D 11/326 523/160 |

(Continued)

FOREIGN PATENT DOCUMENTS

| | | | | |
|---|---|---|---|---|
| JP | 2013-155318 | * | 5/2003 | ............. G03F 7/004 |
| JP | 2005-140993 | * | 6/2005 | ............. G03F 7/075 |

(Continued)

OTHER PUBLICATIONS

CIBA, "Photoinitiators for UV curing", (2003) 8 pages.*

(Continued)

*Primary Examiner* — Martin J Angerbranndt
(74) *Attorney, Agent, or Firm* — Lee & Morse, P.C.

(57) ABSTRACT

A photosensitive resin composition, a pixel defining layer, and a display device, the composition including a binder resin; a photopolymerizable monomer; a photopolymerization initiator including a first photopolymerization initiator and a second photopolymerization initiator; a black colorant; and a solvent, wherein the first photopolymerization initiator is represented by Chemical Formula 1, the second photopolymerization initiator has a different maximum absorption wavelength from the first photopolymerization initiator, and the first photopolymerization initiator and the second photopolymerization initiator are included in a weight ratio of about 3:7 to about 7:3, (Continued)

[Chemical Formula 1]

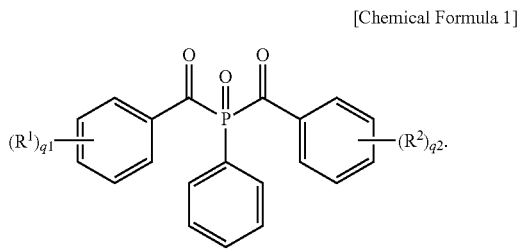

11 Claims, 2 Drawing Sheets

(51) Int. Cl.
*G03F 7/029* (2006.01)
*G03F 7/095* (2006.01)
*H01L 27/32* (2006.01)
*H01L 51/52* (2006.01)
*C08G 73/10* (2006.01)
*C08G 73/14* (2006.01)
*C09D 179/08* (2006.01)
*G03F 7/00* (2006.01)

(52) U.S. Cl.
CPC ..... *C08G 73/1042* (2013.01); *C08G 73/1064* (2013.01); *C08G 73/1067* (2013.01); *C08G 73/1071* (2013.01); *C09D 179/08* (2013.01); *G03F 7/0007* (2013.01); *G03F 7/029* (2013.01); *G03F 7/031* (2013.01); *G03F 7/095* (2013.01); *H01L 27/3246* (2013.01); *H01L 51/5284* (2013.01)

(56) References Cited

U.S. PATENT DOCUMENTS

| | | | | |
|---|---|---|---|---|
| 9,557,446 | B2* | 1/2017 | Kang | G03F 7/0387 |
| 9,746,767 | B2* | 8/2017 | Lee | G03F 7/0007 |
| 10,120,280 | B2* | 11/2018 | Kim | H01L 27/3246 |
| 10,146,129 | B2* | 12/2018 | Kim | G03F 7/0007 |
| 2009/0292039 | A1* | 11/2009 | Sawamoto | C07D 209/88 522/50 |
| 2010/0214506 | A1* | 8/2010 | Gaides | G02B 5/0263 349/61 |
| 2010/0248088 | A1* | 9/2010 | Naisby | G03F 7/001 430/2 |
| 2012/0171434 | A1* | 7/2012 | Herlihy | C08F 2/50 428/195.1 |
| 2013/0222499 | A1* | 8/2013 | Cong | B41J 2/2107 347/102 |
| 2014/0045121 | A1* | 2/2014 | Lee | G03F 7/033 430/280.1 |
| 2014/0275319 | A1* | 9/2014 | Yamada | C09D 11/101 522/99 |
| 2014/0295148 | A1* | 10/2014 | Maekawa | G03F 7/038 428/195.1 |
| 2015/0116415 | A1* | 4/2015 | Chretien | B41M 5/0256 347/20 |
| 2018/0149974 | A1* | 5/2018 | Kim | G03F 7/0048 |

FOREIGN PATENT DOCUMENTS

| | | | | |
|---|---|---|---|---|
| JP | 2010-134116 A | | 6/2010 | |
| JP | 2013-064967 | * | 4/2013 | ............ G03F 7/027 |
| JP | 2013-082924 | * | 5/2013 | ............ C08F 290/06 |
| JP | 2013-114008 | * | 6/2013 | ............ G03F 7/027 |
| JP | 2013-114008 A | | 6/2013 | |
| KR | 10-2012-0096427 A | | 8/2012 | |
| KR | 10-2012-0097462 A | | 9/2012 | |
| TW | 201423270 A | | 6/2014 | |
| TW | 201527876 A | | 7/2015 | |
| WO | 2006/129924 | * | 12/2006 | |
| WO | 2012/147626 | * | 11/2012 | ............ G03F 7/075 |
| WO | 2014/194631 | * | 12/2014 | ............ G02B 1/04 |

OTHER PUBLICATIONS

Taiwanese Search Report issued with Office Action dated Aug. 30, 2017, of the corresponding Taiwanese Patent Application No. 106108303.

Provisional double patenting rejection over claims of the above-identified application; USPTO Office action dated Apr. 13, 2018, in U.S. Appl. No. 15/499,171.

Provisional double patenting rejection over claims of the above-identified application; USPTO Office action dated May 14, 2018, in U.S. Appl. No. 15/498,885.

* cited by examiner

PHOTOSENSITIVE RESIN COMPOSITION, BLACK PIXEL DEFINING LAYER USING THE SAME AND DISPLAY DEVICE

CROSS-REFERENCE TO RELATED APPLICATION

Korean Patent Application No. 10-2016-0123228, filed on Sep. 26, 2016, in the Korean Intellectual Property Office, and entitled: "Photosensitive Resin Composition, Black Pixel Defining Layer Using the Same and Display Device," is incorporated by reference herein in its entirety.

BACKGROUND

1. Field

Embodiments relate to a photosensitive resin composition, a black pixel defining layer using the same, and a display device.

2. Description of the Related Art

Conventionally, a color filter such as a color liquid crystal display and the like may use a black photosensitive resin composition as a barrier rib material on a border between colored layers in order to increase a contrast or chromophore effect. On the other hand, an organic light emitting diode (OLED) includes TFT, an light emitting device, and an electrode supplying electricity, and herein, the TFT and the electrode use a metal having high electrical conductivity and thus have very high light reflectance.

SUMMARY

Embodiments are directed to a photosensitive resin composition, a black pixel defining layer using the same, and a display device.

The embodiments may be realized by providing a photosensitive resin composition including a binder resin; a photopolymerizable monomer; a photopolymerization initiator including a first photopolymerization initiator and a second photopolymerization initiator; a black colorant; and a solvent, wherein the first photopolymerization initiator is represented by Chemical Formula 1, the second photopolymerization initiator has a different maximum absorption wavelength from the first photopolymerization initiator, and the first photopolymerization initiator and the second photopolymerization initiator are included in a weight ratio of about 3:7 to about 7:3,

[Chemical Formula 1]

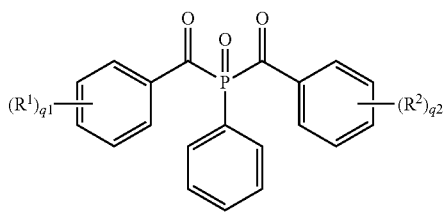

wherein, in Chemical Formula 1, $R^1$ and $R^2$ are each independently a hydrogen atom, a substituted or unsubstituted C1 to C20 alkyl group, a substituted or unsubstituted C1 to C20 alkoxy group, or a substituted or unsubstituted C6 to C20 aryl group, and q1 and q2 are each independently an integer of 0 to 5.

The first photopolymerization initiator and the second photopolymerization initiator may be included in a weight ratio of about 4:6 to about 6:4.

The first photopolymerization initiator may have maximum absorbance in a wavelength region of about 270 nm to about 300 nm or about 390 nm to about 450 nm.

The second photopolymerization initiator may be represented by one of the following Chemical Formula 2 to Chemical Formula 6:

[Chemical Formula 2]

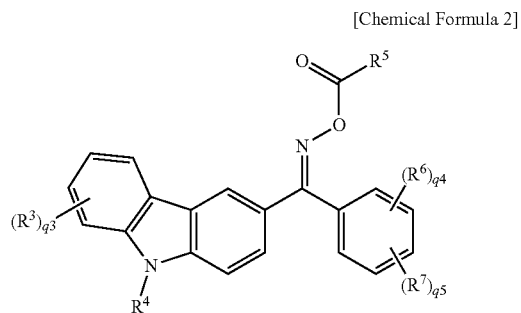

wherein, in Chemical Formula 2, $R^3$ is a nitro group, $R^4$ and $R^5$ are each independently a substituted or unsubstituted C1 to C10 alkyl group or a substituted or unsubstituted C1 to C10 alkoxy group, $R^6$ is a substituted or unsubstituted C1 to C10 alkyl group, $R^7$ is a substituted or unsubstituted C1 to C10 alkoxy group, and q3, q4, and q5 are each independently an integer of 0 to 5, and $1 \leq q4+q5 \leq 5$,

[Chemical Formula 3]

wherein, in Chemical Formula 3, $R^8$ to $R^{10}$ are each independently a substituted or unsubstituted C1 to C10 alkyl group or a substituted or unsubstituted C1 to C10 alkoxy group, $R^{11}$ is a substituted or unsubstituted C1 to C10 alkyl group, and q6 is an integer of 0 to 5,

[Chemical Formula 4]

wherein, in Chemical Formula 4, $R^{12}$ is a substituted or unsubstituted C1 to C10 alkyl group or a substituted or unsubstituted C3 to C10 cycloalkyl group,

[Chemical Formula 5]

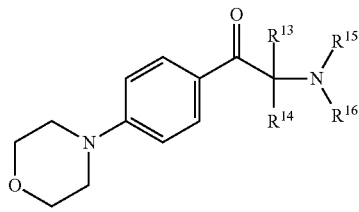

wherein, in Chemical Formula 5, $R^{13}$ to $R^{16}$ are each independently a substituted or unsubstituted C1 to C10 alkyl group,

[Chemical Formula 6]

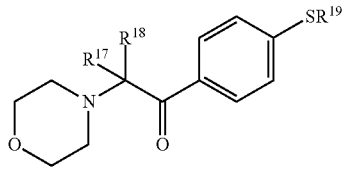

wherein, in Chemical Formula 6, $R^{17}$ to $R^{19}$ are each independently a substituted or unsubstituted C1 to C10 alkyl group.

The binder resin may include at least two selected from a polyamic acid-polyimide copolymer, a cardo-based binder resin, and an acryl-based binder resin.

The binder resin may include the polyamic acid-polyimide copolymer, and the polyamic acid-polyimide copolymer may include a polyamic acid repeating unit and a polyimide repeating unit, the polyamic acid repeating unit and polyimide repeating unit being included in a mole ratio of about 5:5 to about 9:1.

The binder resin may include the polyamic acid-polyimide copolymer, and the polyamic acid-polyimide copolymer may have a weight average molecular weight of about 5,000 g/mol to about 20,000 g/mol.

The black colorant may include an organic black pigment and an inorganic black pigment.

The organic black pigment may be included in an amount of about 5 parts by weight to about 10 parts by weight relative to 1 part by weight of the inorganic black pigment.

The photosensitive resin composition may include about 1 wt % to about 15 wt % of the binder resin; about 1 wt % to about 15 wt % of the photopolymerizable monomer; about 0.1 wt % to about 5 wt % of the photopolymerization initiator; and about 1 wt % to about 15 wt % of the black colorant; all wt % being based on a total weight of the photosensitive resin composition.

The embodiments may be realized by providing a pixel defining layer manufactured using the photosensitive resin composition according to an embodiment.

The embodiments may be realized by providing a display device including the black pixel defining layer according to an embodiment.

The display device may be an organic light emitting diode (OLED).

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
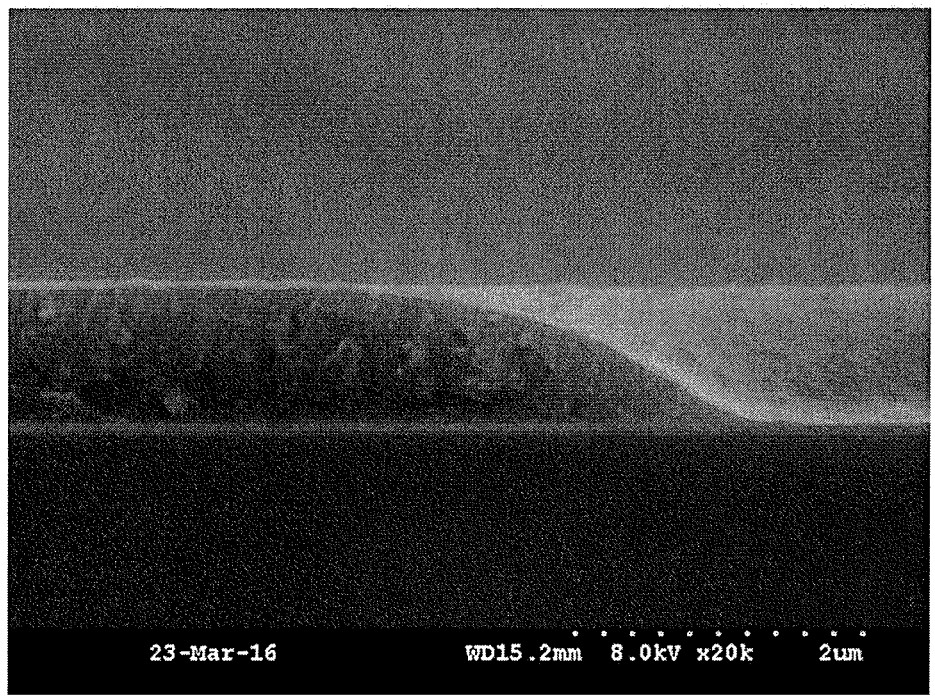
FIG. 1 illustrates a scanning electron microscope (SEM) image of a cross-section of a black pixel defining layer manufactured using the photosensitive resin composition according to Example 1.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. Like reference numerals refer to like elements throughout.

As used herein, when specific definition is not otherwise provided, "alkyl group" refers to a C1 to C20 alkyl group, the term "alkenyl group" refers to a C2 to C20 alkenyl group, the term "cycloalkenyl group" refers to a C3 to C20 cycloalkenyl group, the term "heterocycloalkenyl group" refers to a C3 to C20 heterocycloalkenyl group, the term "aryl group" refers to a C6 to C20 aryl group, the term "arylalkyl group" refers to a C6 to C20 arylalkyl group, the term "alkylene group" refers to a C1 to C20 alkylene group, the term "arylene group" refers to a C6 to C20 arylene group, the term "alkylarylene group" refers to a C6 to C20 alkylarylene group, the term "heteroarylene group" refers to a C3 to C20 heteroarylene group, and the term "alkoxylene group" refers to a C1 to C20 alkoxylene group.

As used herein, when specific definition is not otherwise provided, "substituted" refers to one substituted with a substituent of a halogen atom (F, Cl, Br, I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof, instead of at least one hydrogen.

As used herein, when specific definition is not otherwise provided, the term "hetero" refers to one including at least one heteroatom selected from N, O, S and P in a chemical formula.

As used herein, when specific definition is not otherwise provided, "(meth)acrylate" refers to both "acrylate" and "methacrylate", and "(meth)acrylic acid" refers to "acrylic acid" and "methacrylic acid".

As used herein, when specific definition is not otherwise provided, the term "combination" refers to mixing or copolymerization.

As used herein, when specific definition is not otherwise provided, an unsaturated bond includes a bond between other atoms such as a carbonyl bond, or an azo bond as well as a multi-bond between carbon-carbon atoms.

In the chemical formula of the present specification, unless a specific definition is otherwise provided, hydrogen is boned at the position when a chemical bond is not drawn where supposed to be given.

In the present specification, a cardo-based resin refers to a resin including at least one functional group selected from Chemical Formula 14-1 to Chemical Formula 14-11.

As used herein, when specific definition is not otherwise provided, "*" indicates a point where the same or different atom or chemical formula is linked.

A photosensitive resin composition according to an embodiment may include, e.g., (A) a binder resin; (B) a photopolymerizable monomer; (C) a photopolymerization initiator including a first photopolymerization initiator and a second photopolymerization initiator; (D) a black colorant; and (E) a solvent. The first photopolymerization initiator may be represented by Chemical Formula 1. The second photopolymerization initiator may have a different maximum absorption wavelength from the first photopolymerization initiator. The first photopolymerization initiator and the second photopolymerization initiator may be included in a weight ratio of about 3:7 to about 7:3.

[Chemical Formula 1]

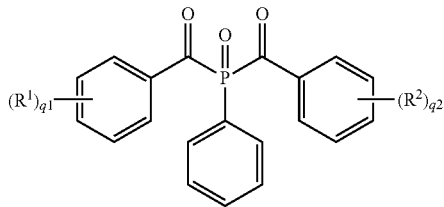

In Chemical Formula 1, $R^1$ and $R^2$ may each independently be or include, e.g., a hydrogen atom, a substituted or unsubstituted C1 to C20 alkyl group, a substituted or unsubstituted C1 to C20 alkoxy group, or a substituted or unsubstituted C6 to C20 aryl group. q1 and q2 may each independently be, e.g., an integer of 0 to 5.

In an implementation, in Chemical Formula 1, $R^1$ and $R^2$ may each independently be or include, e.g., a substituted or unsubstituted C1 to C20 alkyl group, and q1 and q2 may each be 3.

A photosensitive resin composition according to an embodiment may include the first photopolymerization initiator represented by Chemical Formula 1 and the second photopolymerization initiator having a different maximum absorption wavelength from the first photopolymerization initiator in about 3:7 to about 7:3 weight ratio, and thereby sensitivity may be improved and high taper angle through a color filter process may be realized.

Hereinafter each component is specifically described.

(C) Photopolymerization Initiator

The photopolymerization initiator may include the first photopolymerization initiator represented by Chemical Formula 1 and the second photopolymerization initiator having a different maximum absorption wavelength from the first photopolymerization initiator in about 3:7 to about 7:3 weight ratio.

An external light reflection issue may be fundamentally and effectively solved by designing a photosensitive resin composition to absorb reflected light through introduction of a light-blocking material into a transparent barrier rib material. Herein, a non-light emitting region may be designed to be black, and the photosensitive resin composition may help improve a contrast ratio and visibility since light reflected from a metal layer may not be transmitted and simultaneously secure a high aperture ratio.

A black photosensitive material including a light-blocking material in general may not sufficiently pass light deep to the bottom and thus may be insufficiently photocured, e.g., cured on top but not cured on the bottom (unbalanced) and resultantly, may weaken developability and lack of pattern characteristics and a process margin.

In order to strengthen the weak points of a black photosensitive resin composition, a long wavelength initiator may be applied thereto in order to sufficiently cure its deep part (deep bottom), but the black photosensitive resin composition may still be weak about sensitivity, taper characteristics, and the like.

The photosensitive resin composition according to an embodiment may include a first photopolymerization initiator represented by Chemical Formula 1 and a second photopolymerization initiator differing from the first photopolymerization initiator as the photopolymerization initiator. The first photopolymerization initiator may have a maximum absorbance in a wavelength region of about 270 nm to about 300 nm or about 390 nm to about 450 nm, e.g., a maximum absorbance in a long wavelength region (about 390 nm to about 450 nm) as well as a short wavelength region (about 270 nm to about 300 nm), and the second photopolymerization initiator may have a different maximum absorption wavelength from that of the first photopolymerization initiator and thus helps light absorbed in a wider wavelength region and increases efficiency of the photopolymerization initiator and resultantly, may make the photosensitive resin composition sufficiently cured at the bottom and help improve its pattern characteristics and pattern close-contacting force. For example, as for a photosensitive resin composition including a black colorant, the photosensitive material absorbs/blocks light and thus may deteriorate efficiency of a photopolymerization initiator. The photosensitive resin composition according to an embodiment may include a photopolymerization initiator absorbing light at various different wavelengths, viz., the first photopolymerization initiator and the second photopolymerization initiator in an appropriate weight ratio, e.g., about 3:7 to about 7:3, and thus may be prevented from deterioration of a contrast ratio and visibility and improve sensitivity and adjust a pattern taper within the above weight ratio range. Maintaining the amount of the first photopolymerization initiator at about 30 parts by weight or greater based on the entire amount of the photopolymerization initiator (100 parts by weight) may help ensure that a taper angle is increased up to greater than or equal to about 40°, and accordingly, a shortage (due to a short circuit when a voltage is applied to a display device) may be prevented. Maintaining the amount of the first photopolymerization initiator at about 70 parts by weight or less, based on the entire amount of the photopolymerization initiator (100 parts by weight), may help ensure that sensitivity is not deteriorated.

In an implementation, the first photopolymerization initiator and second photopolymerization initiator may be included in a weight ratio of about 4:6 to about 6:4, e.g., in a weight ratio of about 5:5.

In addition, when the first photopolymerization initiator and the second photopolymerization initiator having a different maximum absorption wavelength from the first photopolymerization initiator are included in a weight ratio of about 3:7 to about 7:3, a photosensitive resin composition including a polyamic acid-polyimide copolymer as a binder resin, which will be post-described, may be balancedly or uniformly cured on top and at the bottom.

The first photopolymerization initiator may have a maximum absorbance in a wavelength region of about 270 nm to about 300 nm or about 390 nm to about 450 nm.

The first photopolymerization initiator may have a maximum absorbance in a wavelength region of about 310 nm to about 380 nm.

In an implementation, the second photopolymerization initiator may be represented by one of Chemical Formula 2 to Chemical Formula 6.

[Chemical Formula 2]

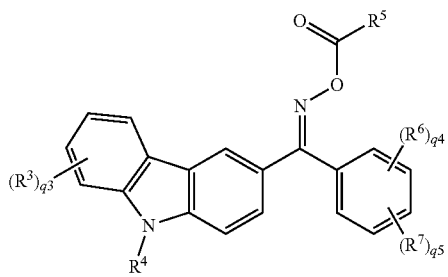

In Chemical Formula 2, $R^3$ may be, e.g., a nitro group, $R^4$ and $R^5$ may each independently be or include, e.g., a substituted or unsubstituted C1 to C10 alkyl group or a substituted or unsubstituted C1 to C10 alkoxy group, $R^6$ may be or may include, e.g., a substituted or unsubstituted C1 to C10 alkyl group, $R^7$ may be or may include, e.g., a substituted or unsubstituted C1 to C10 alkoxy group, and q3 to q5 may each independently be, e.g., an integer ranging from 0 to 5, and 1≤q4+q5≤5.

[Chemical Formula 3]

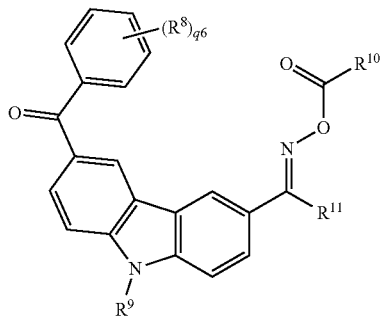

In Chemical Formula 3, $R^8$ to $R^{10}$ may each independently be or include, e.g., a substituted or unsubstituted C1 to C10 alkyl group or a substituted or unsubstituted C1 to C10 alkoxy group, $R^{11}$ may be or may include, e.g., a substituted or unsubstituted C1 to C10 alkyl group, and q6 may be, e.g., an integer ranging from 0 to 5.

[Chemical Formula 4]

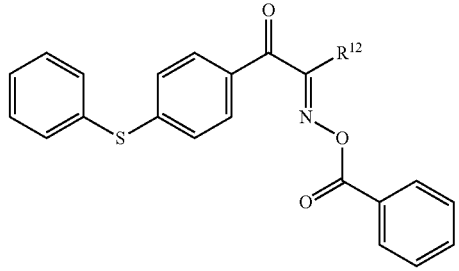

In Chemical Formula 4, $R^{12}$ may be or may include, e.g., a substituted or unsubstituted C1 to C10 alkyl group or a substituted or unsubstituted C3 to C10 cycloalkyl group.

[Chemical Formula 5]

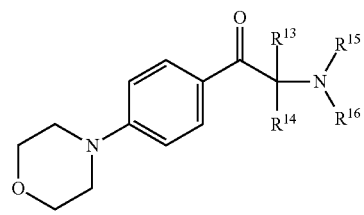

In Chemical Formula 5, $R^{13}$ to $R^{16}$ may each independently be or include, e.g., a substituted or unsubstituted C1 to C10 alkyl group.

[Chemical Formula 6]

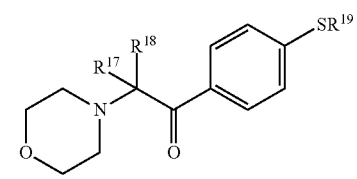

In Chemical Formula 6, $R^{17}$ to $R^{19}$ may each independently be or include, e.g., a substituted or unsubstituted C1 to C10 alkyl group.

In an implementation, the photopolymerization initiator represented by Chemical Formula 2 may have a maximum absorbance in a wavelength region of about 370 nm to about 380 nm.

In an implementation, the photopolymerization initiators represented by Chemical Formula 3 and Chemical Formula 4 may independently have a maximum absorbance in a wavelength region of about 330 nm to about 340 nm.

In an implementation, the photopolymerization initiator represented by Chemical Formula 5 may have a maximum absorbance in a wavelength region of about 320 nm to about 330 nm.

In an implementation, the photopolymerization initiator represented by Chemical Formula 6 may have a maximum absorbance in a wavelength region of about 310 nm to about 320 nm.

In an implementation, the second photopolymerization initiator may be represented by one of Chemical Formula 2-1 to Chemical Formula 6-1.

[Chemical Formula 2-1]

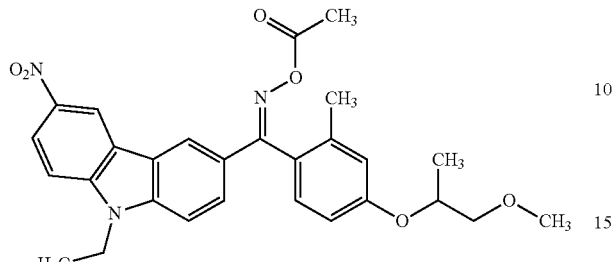

[Chemical Formula 3-1]

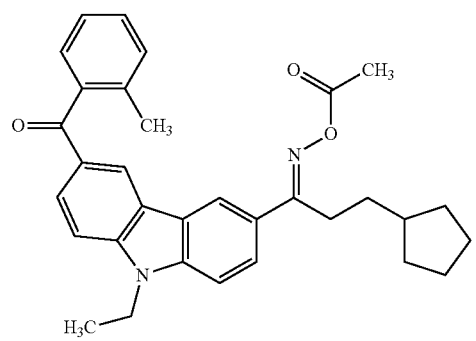

[Chemical Formula 3-2]

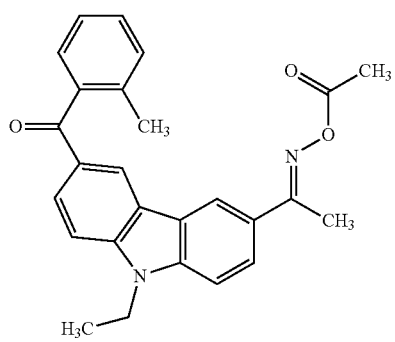

[Chemical Formula 4-1]

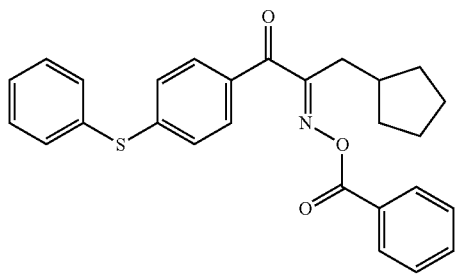

[Chemical Formula 4-2]

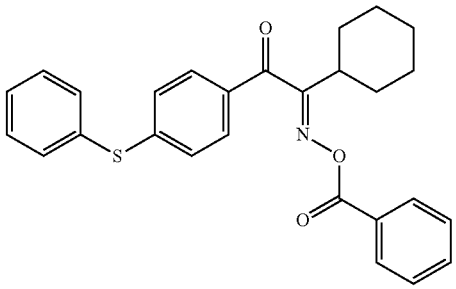

[Chemical Formula 5-1]

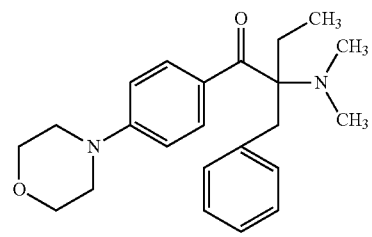

[Chemical Formula 6-1]

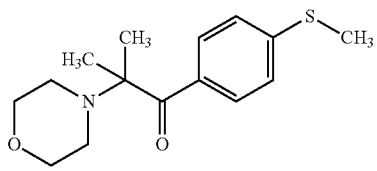

The photosensitive resin composition according to an embodiment may be developed in a 2.38% TMAH solution so that it may be used as a black pixel barrier rib material in a display device such as an organic light emitting diode (OLED) and the like.

In an implementation, the photopolymerization initiator may further include, e.g., a carbazole-based compound, a diketone-based compound, a sulfonium borate-based compound, a diazo-based compound, an imidazole-based compound, a biimidazole-based compound, or the like, in addition to the first photopolymerization initiator and second photopolymerization initiator.

In an implementation, the photopolymerization initiator may be used with a photosensitizer capable of causing a chemical reaction by absorbing light and becoming excited and then, transferring its energy.

Examples of the photosensitizer may include tetraethylene glycol bis-3-mercapto propionate, pentaerythritol tetrakis-3-mercapto propionate, dipentaerythritol tetrakis-3-mercapto propionate, and the like.

In an implementation, the photopolymerization initiator may be included in an amount of about 0.1 wt % to about 5 wt %, e.g. about 0.3 wt % to about 3 wt %, based on a total weight of the photosensitive resin composition. When the photopolymerization initiator is included within the ranges, excellent reliability may be secured due to sufficiently curing during exposure in a pattern-forming process, a pattern may have excellent resolution and close-contacting properties as well as excellent heat resistance, light resistance, and chemical resistance, and transmittance may be prevented from deterioration due to a non-reaction initiator.

(A) Binder Resin

The photosensitive resin composition according to an embodiment may include the binder resin. In an implementation, the binder resin may include, e.g., at least two selected from a polyamic acid-polyimide copolymer, a cardo-based binder resin, and an acryl-based binder resin.

For example, the polyamic acid-polyimide copolymer may be an alkali soluble polyamic acid-polyimide copolymer.

In an implementation, the binder resin included in a photosensitive resin composition according to an embodiment may simultaneously have a polyimide unit having solubility in an organic solvent and a polyamic acid unit having a polyimide precursor structure and thus may provide a black pixel defining layer having high heat resistance.

The black pixel defining layer having excellent heat resistance and pattern-forming capability may be realized by copolymerizing polyimide, a main structure of a polymer in order to prevent excessive dissolution characteristics of polyamic acid, e.g., a polyimide precursor, in an alkali aqueous solution and control solubility and thus obtaining appropriate solubility between an exposed region and a non-exposed region during a pattern formation.

For example, the polyamic acid-polyimide copolymer may include a polyamic acid repeating unit and a polyimide repeating unit. In an implementation, the polyamic acid repeating unit and the polyimide repeating unit may be included in a mole ratio of about 5:5 to about 9:1, e.g. about 5:5 to about 8:2, about 5:5 to about 7:3, or about 5:5 to about 6:4. When the polyamic acid repeating unit and the polyimide repeating unit are included in a mole ratio within the ranges, a step of about 1 µm may be easily realized, and a copolymerization resin having excellent cross-linking characteristics may be obtained. If the polyimide repeating unit and the polyamic acid repeating unit were to be used out of the mole ratio range in the copolymerization resin, e.g., if the polyimide repeating unit were to be included in a greater amount than the polyamic acid repeating unit, developability of the composition could be deteriorated.

For example, as for the copolymer, a mole ratio of the polyimide unit already having an imidization structure in a solution state may be adjusted to easily control solubility of a photosensitive resin itself in an alkali aqueous solution. In this way, the photosensitive resin may have appropriate solubility in the alkali aqueous solution by controlling a copolymerization ratio between an alkali-soluble imide structure and a polyamic acid structure of a polyimide precursor, and excellent heat resistance may be obtained by forming a fine pattern by introducing a cross-linking functional group at the terminal end (and/or a chain) of a copolymerization resin to cross-link an exposed region when light in a UV region is radiated by a light source and developing a non-exposed region and then, thermally curing the pattern at a high temperature of greater than or equal to about 250° C.

In an implementation, the polyamic acid-polyimide copolymer may have a weight average molecular weight of about 5,000 g/mol to about 20,000 g/mol, e.g. about 6,000 g/mol to about 10,000 g/mol. When the copolymer has a weight average molecular weight within the ranges, excellent pattern-forming capability may be obtained, and a thin film may having excellent mechanical thermal characteristics may be provided.

The copolymer may have an unsaturated double bond on at least one terminal end, e.g., at both terminal ends of the copolymerization resin. The unsaturated double bond may be present in the middle of a chain of the copolymerization resin in addition to the terminal ends of the copolymer. The unsaturated double bond at the terminal end (and/or in the middle of a chain) may work as a cross-linking functional group and thus may help improve cross-linking characteristics of the copolymer. For example, a photosensitive resin composition having excellent contrast may be realized by introducing a monomer cross-linked by the photopolymerization initiator at the terminal end of a main structure (and/or in the middle of a chain) in order to apply cross-linking characteristics through exposure of the copolymer itself, and the monomer cross-linked by the photopolymerization initiator may be represented by one selected from Chemical Formula 1 to Chemical Formula 4.

In an implementation, the unsaturated double bond may be derived from a compound represented by one of the following Chemical Formula 7 to Chemical Formula 10.

[Chemical Formula 7]

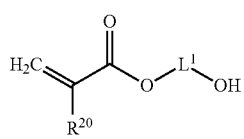

[Chemical Formula 8]

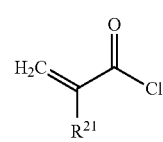

[Chemical Formula 9]

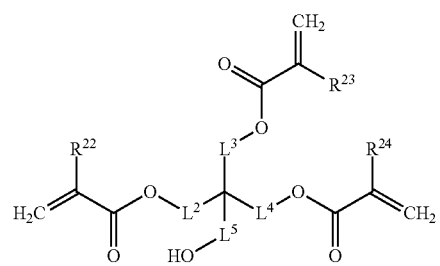

[Chemical Formula 10]

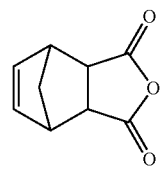

In Chemical Formula 7 to Chemical Formula 10, $R^{20}$ to $R^{24}$ may each independently be or include, e.g., a hydrogen atom or a substituted or unsubstituted C1 to C10 alkyl group, and $L^1$ to $L^5$ may each independently be or include, e.g., a single bond or a substituted or unsubstituted C1 to C10 alkylene group.

In an implementation, the copolymer may be represented by Chemical Formula 11.

[Chemical Formula 11]

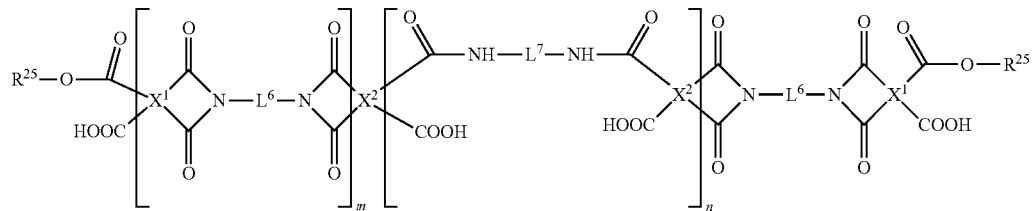

In Chemical Formula 11, $X^1$ and $X^2$ may each independently be or include, e.g., a substituted or unsubstituted tetravalent alicyclic organic group or a substituted or unsubstituted tetravalent aromatic organic group, $L^6$ and $L^7$ may each independently be or include, e.g., a single bond, a substituted or unsubstituted C1 to C10 alkylene group, a substituted or unsubstituted C3 to C10 cycloalkylene group or a substituted or unsubstituted C6 to C20 arylene group, $R^{25}$ may be or may include, e.g., a substituted or unsubstituted acryl group, a substituted or unsubstituted methacryl group or a substituted or unsubstituted norbornene group, and m and n may each independently be, e.g., an integer of 1 to 100,000.

In an implementation, the tetravalent aromatic organic group may be represented by Chemical Formula 12.

[Chemical Formula 12]

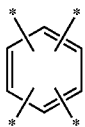

In an implementation, the C6 to C20 arylene group may include a linking group represented by Chemical Formula 13.

[Chemical Formula 13]

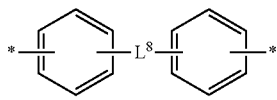

In Chemical Formula 13, $L^8$ may be or may include, e.g., a substituted or unsubstituted C1 to C8 alkylene group.

If a binder resin were to include only polyamic acid-polyimide copolymer, melting properties could be deteriorated. In an implementation, the binder resin may further include an acryl-based binder resin and/or a cardo-based binder resin in addition to the polyamic acid-polyimide copolymer.

In an implementation, the acryl-based binder resin may be, e.g., a copolymer of a first ethylenic unsaturated monomer and a second ethylenic unsaturated monomer that is copolymerizable therewith, and may be a resin including at least one acryl-based repeating unit.

In an implementation, the first ethylenic unsaturated monomer may include, e.g., an ethylenic unsaturated monomer including at least one carboxyl group. Examples of the monomer may include acrylic acid, methacrylic acid, maleic acid, itaconic acid, fumaric acid, or a combination thereof.

In an implementation, the first ethylenic unsaturated monomer may be included in an amount of about 5 to about 50 wt %, e.g., about 10 to about 40 wt %, based on the total amount of the acryl-based binder resin.

In an implementation, the second ethylenic unsaturated monomer may include, e.g., an aromatic vinyl compound such as styrene, α-methylstyrene, vinyl toluene, vinylbenzylmethylether or the like; an unsaturated carboxylate ester compound such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, or the like; an unsaturated carboxylic acid amino alkyl ester compound such as 2-aminoethyl(meth)acrylate, 2-dimethylaminoethyl (meth)acrylate, or the like; a carboxylic acid vinyl ester compound such as vinyl acetate, vinyl benzoate, or the like; an unsaturated carboxylic acid glycidyl ester compound such as glycidyl(meth)acrylate, or the like; a vinyl cyanide compound such as (meth)acrylonitrile or the like; an unsaturated amide compound such as (meth)acrylamide, or the like. These may be used singularly or as a mixture of two or more.

Examples of the acryl-based resin may include an acrylic acid/benzylmethacrylate copolymer, a methacrylic acid/benzylmethacrylate copolymer, a methacrylic acid/benzylmethacrylate/styrene copolymer, a methacrylic acid/benzylmethacrylate/2-hydroxyethylmethacrylate copolymer, a methacrylic acid/benzylmethacrylate/styrene/2-hydroxyethylmethacrylate copolymer, and the like. These may be used singularly or as a mixture of two or more.

The acryl-based binder resin may have a weight average molecular weight of, e.g., about 5,000 g/mol to about 15,000 g/mol. When the acryl-based binder resin has a weight average molecular weight within the range, the photosensitive resin composition has good physical and chemical properties, appropriate viscosity, and close contacting properties with a substrate during manufacture of a color filter.

The acryl-based binder resin may have an acid value of, e.g., about 80 mgKOH/g to about 130 mgKOH/g. When the acryl-based binder resin has an acid value within the range, a pixel pattern may have excellent resolution.

In an implementation, the cardo-based binder resin may include, e.g., a repeating unit represented by Chemical Formula 14.

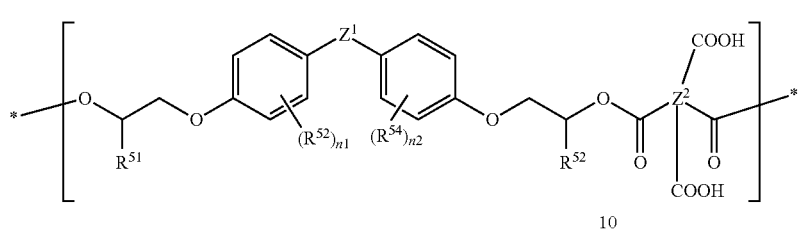

[Chemical Formula 14]

In Chemical Formula 14, $R^{51}$ and $R^{52}$ may each independently be or include, e.g., a hydrogen atom or a substituted or unsubstituted (meth)acryloyloxy alkyl group, $R^{53}$ and $R^{54}$ may each independently be or include, e.g., a hydrogen atom, a halogen atom, or a substituted or unsubstituted C1 to C20 alkyl group, and $Z^1$ may be, e.g., a single bond, O, CO, $SO_2$, $CR^{55}R^{56}$, $SiR^{57}R^{58}$ (wherein, $R^{55}$ to $R^{58}$ are independently a hydrogen atom, or a substituted or unsubstituted C1 to C20 alkyl group) or one of linking groups represented by Chemical Formula 14-1 to Chemical Formula 14-11.

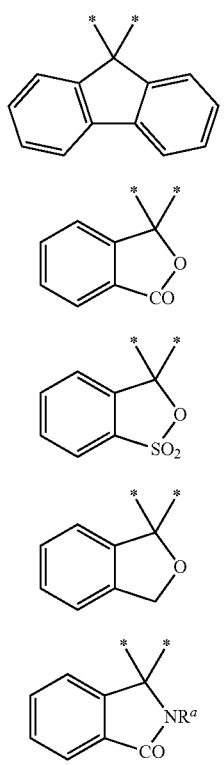

[Chemical Formula 14-1]

[Chemical Formula 14-2]

[Chemical Formula 14-3]

[Chemical Formula 14-4]

[Chemical Formula 14-5]

In Chemical Formula 14-5, $R^a$ may be, e.g., a hydrogen atom, an ethyl group, a $C_2H_4Cl$, $C_2H_4OH$, $CH_2CH{=}CH_2$, or a phenyl group.

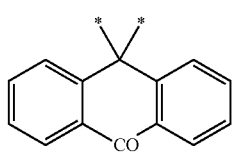

[Chemical Formula 14-6]

-continued

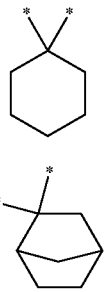

[Chemical Formula 14-7]

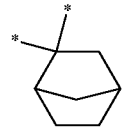

[Chemical Formula 14-8]

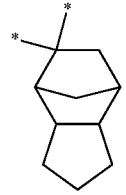

[Chemical Formula 14-9]

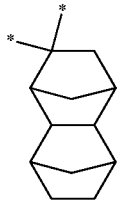

[Chemical Formula 14-10]

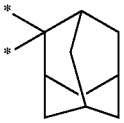

[Chemical Formula 14-11]

$Z^2$ may be, e.g., an acid dianhydride residual group, and n1 and n2 may each independently be, e.g., an integer of 0 to 4.

In an implementation, a weight average molecular weight of the cardo-based binder resin may be about 500 g/mol to about 50,000 g/mol, e.g., about 1,000 g/mol to about 30,000 g/mol. When the cardo-based binder resin a weight average molecular weight within the range, a pattern may be well formed without a residue during manufacture of a light-blocking layer and without loss of a film thickness during development.

In an implementation, the cardo-based binder resin may include a functional group represented by Chemical Formula 15 at least one terminal end.

[Chemical Formula 15]

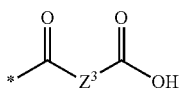

In Chemical Formula 15, $Z^3$ may be, e.g., represented by Chemical Formula 15-1 to Chemical Formula 15-7.

[Chemical Formula 15-1]

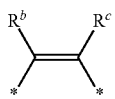

In Chemical Formula 15-1, $R^b$ and $R^c$ may each independently be or include, e.g., hydrogen, a substituted or unsubstituted C1 to C20 alkyl group, an ester group, or an ether group.

[Chemical Formula 15-2]

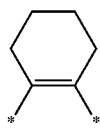

[Chemical Formula 15-3]

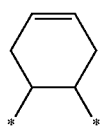

[Chemical Formula 15-4]

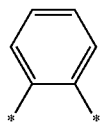

[Chemical Formula 15-5]

In Chemical Formula 15-5, $R^d$ may be or may include, e.g., O, S, NH, a substituted or unsubstituted C1 to C20 alkylene group, a C1 to C20 alkylamine group, or a C2 to C20 allylamine group.

[Chemical Formula 15-6]

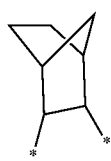

[Chemical Formula 15-7]

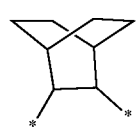

The cardo-based binder resin may be, e.g., prepared by mixing at least two of a fluorene-containing compound such as 9,9-bis(4-oxiranylmethoxyphenyl)fluorene, or the like; an anhydride compound such as benzene tetracarboxylic acid dianhydride, naphthalene tetracarboxylic acid dianhydride, biphenyltetracarboxylic acid dianhydride, benzophenone tetracarboxylic acid dianhydride, pyromellitic dianhydride, cyclobutanetetracarboxylic acid dianhydride, perylenetetracarboxylic acid dianhydride, tetrahydrofuran tetracarboxylic acid dianhydride, tetrahydrophthalic anhydride, or the like; a glycol compound such as ethylene glycol, propylene glycol, polyethylene glycol, or the like; an alcohol compound such as methanol, ethanol, propanol, n-butanol, cyclohexanol, benzylalcohol, or the like; a solvent-based compound such as propylene glycol methylethylacetate, N-methylpyrrolidone, or the like; a phosphorus compound such as triphenylphosphine, or the like; and/or an amine or ammonium salt compound such as tetramethylammonium chloride, tetraethylammonium bromide, benzyldiethylamine, triethylamine, tributylamine, benzyltriethylammonium chloride, or the like.

If a binder resin were to include only the cardo-based binder resin, the composition could be developed too quickly, and thus could have largely deteriorated taper characteristics (a T-top profile is found). Accordingly, the binder resin may be used along with the polyamic acid-polyimide copolymer in an effort to help prevent the deterioration of the taper characteristics.

In the binder resin, an acryl-based binder resin or a cardo-based binder resin may be included in a greater amount than the polyamic acid-polyimide copolymer. For example, the acryl-based binder resin or the cardo-based binder resin may be included ni an amount that is greater than or equal to about twice the amount of the polyamic acid-polyimide copolymer. When more of the acryl-based binder resin or the cardo-based binder resin than the polyamic acid-polyimide copolymer is included, excellent developability and sensitivity may be obtained.

In an implementation, the binder resin may be included in an amount of about 1 wt % to about 15 wt %, e.g. about 3 wt % to about 10 wt %, based on the total weight of the photosensitive resin composition. When the binder resin is included within the ranges, excellent sensitivity, developability, resolution, and pattern linearity may be obtained.

(B) Photopolymerizable Monomer

The photopolymerizable monomer may include, e.g., a mono-functional or multi-functional ester of (meth)acrylic acid including at least one ethylenic unsaturated double bond.

The photopolymerizable monomer may have the ethylenic unsaturated double bond and thus, may facilitate sufficient polymerization during exposure in a pattern-forming process and form a pattern having excellent heat resistance, light resistance, and chemical resistance.

The photopolymerizable monomer may include, e.g., ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy (meth)acrylate, ethylene glycol monomethylether (meth)

acrylate, trimethylol propane tri(meth)acrylate, tris(meth) acryloyloxyethyl phosphate, novolac epoxy (meth)acrylate, or the like.

Commercially available examples of the photopolymerizable monomer may be as follows. The mono-functional (meth)acrylic acid ester may include Aronix M-101®, M-111®, M-114 ® (Toagosei Chemistry Industry Co., Ltd.); KAYARAD TC-110S®, TC-120S® (Nippon Kayaku Co., Ltd.); V-158®, V-2311® (Osaka Organic Chemical Ind., Ltd.), and the like. Examples of a difunctional (meth)acrylic acid ester may include Aronix M-210®, M-240®, M-6200® (Toagosei Chemistry Industry Co., Ltd.), KAYARAD HDDA®, HX-220®, R-604® (Nippon Kayaku Co., Ltd.), V-260®, V-312®, V-335 HP® (Osaka Organic Chemical Ind., Ltd.), and the like. Examples of a tri-functional (meth) acrylic acid ester may include Aronix M-309®, M-400®, M-405®, M-450®, M-7100®, M-8030®, M-8060® (Toagosei Chemistry Industry Co., Ltd.), KAYARAD TMPTA®, DPCA-20®, DPCA-30®, DPCA-60®, DPCA-120® (Nippon Kayaku Co., Ltd.), V-295®, V-300®, V-360®, V-GPT®, V-3PA®, V-400® (Osaka Yuki Kayaku Kogyo Co. Ltd.), or the like. These products may be used singularly or as a mixture of two or more.

In an implementation, the photopolymerizable monomer may be treated with acid anhydride to improve developability.

In an implementation, the photopolymerizable monomer may be included in an amount of about 1 wt % to about 15 wt %, e.g., about 3 wt % to about 10 wt %, based on the total weight of the photosensitive resin composition. When the photopolymerizable monomer is included within the range, the reactive unsaturated compound may be sufficiently cured during exposure in a pattern-forming process, and thus reliability and developability with an alkali developing solution may be improved.

(D) Black Colorant

When a photosensitive resin film manufactured by exposing, developing, and curing the photosensitive resin composition has high optical density, the photosensitive resin film may be used as a black pixel barrier layer. If an inorganic black colorant, e.g., an inorganic black pigment were to be used alone as a black colorant in the photosensitive resin composition, optical density, e.g., light-blocking property may be increased, but transmittance in a near infrared region (about 800 nm to about 900 nm) could difficult to secure, and a process margin could be much deteriorated. The photosensitive resin composition according to an embodiment may include both an organic black colorant and the inorganic black colorant as a black colorant. The organic black colorant, e.g., the organic black pigment may include, e.g., a lactam-based organic black, RGB black, RVB black, or the like. The inorganic black colorant, e.g., the inorganic black pigment may include, e.g., aniline black, perylene black, titanium black, cyanine black, lignin black, carbon black, or a combination thereof.

The RGB black, RVB black, and the like indicate a pigment showing black by mixing at least two color pigments out of a red pigment, a green pigment, a blue pigment, a violet pigment, a yellow pigment, a purple pigment, and the like.

The organic black pigment may be included in an amount of, e.g., about 5 parts by weight to about 10 parts by weight relative to 1 part by weight of the inorganic black pigment. Herein, the composition may have an excellent melt flow and thus may realize a soft pattern having a taper angle of less than about 40° and also, may maintain a low dielectric constant (low-k) and realize an appropriate performance as an insulation material.

As described above, if the black colorant were to include only the inorganic black pigment such as carbon black and the like, excellent light-blocking property and thus high optical density may be obtained and, since the inorganic black pigment such as carbon black and the like may have UV transmittance of 0%, the photosensitive resin composition could be surface-cured and not internally cured during the exposure. Thus, a process margin could be deteriorated during the development. The photosensitive resin composition according to an embodiment may include the organic black colorant securing light-blocking properties in a visible ray region but transmittance in a near infrared ray region for photocuring along with the inorganic black pigment as the black colorant.

The black colorant may have an optical density of about 1 to about 3, e.g., 1 to 2 per 1 μm.

In an implementation, the black colorant may be used with a color calibrator, e.g., an anthraquinone-based pigment, a perylene-based pigment, a phthalocyanine-based pigment, an azo-based pigment, or the like.

A dispersing agent may be used in order to help improve dispersion of the black colorant such as the pigment or the color calibrator. For example, the black colorant such as the pigment or the color calibrator may be surface-pretreated with a dispersing agent, or the black colorant such as the pigment or the color calibrator and a dispersing agent may be added together during preparation of the resin composition.

The dispersing agent may be a non-ionic dispersing agent, an anionic dispersing agent, a cationic dispersing agent, or the like. Examples of the dispersing agent may include polyalkylene glycol and esters thereof, polyoxyalkylene, a polyhydric alcohol ester alkylene oxide addition product, an alcohol alkylene oxide addition product, a sulfonate ester, a sulfonate salt, a carboxylate ester, a carboxylate salt, an alkylamide alkylene oxide addition product, an alkyl amine, and the like, and may be used singularly or as a mixture of two or more.

Commercially available examples of the dispersing agent may include DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like made by BYK Co., Ltd.; EFKA-47, EFKA-47EA, EFKA-48, EFKA-49, EFKA-100, EFKA-400, EFKA-450, and the like made by EFKA Chemicals Co.; Solsperse 5000, Solsperse 12000, Solsperse 13240, Solsperse 13940, Solsperse 17000, Solsperse 20000, Solsperse 24000GR, Solsperse 27000, Solsperse 28000, and the like made by Zeneka Co.; or PB711, or PB821 made by Ajinomoto Inc.

The dispersing agent may be included in an amount of about 0.1 to about 15 wt %, based on the total weight of the photosensitive resin composition. When the dispersing agent is included within the range, the resin composition has excellent dispersion property and thus, may have excellent stability, developability, and pattern-forming capability during manufacture of a black column spacer.

The black colorant such as the pigment may be pre-treated using a water-soluble inorganic salt and a wetting agent. When the black colorant such as the pigment is pre-treated, a primary particle of the pigment may become finer.

The pre-treatment may be performed by kneading the black colorant such as the pigment with a water-soluble inorganic salt and a wetting agent and then, filtering and washing the knead pigment.

The kneading may be performed at a temperature ranging from about 40° C. to about 100° C., and the filtering and washing may be performed by filtering the pigment after washing away an inorganic salt with water and the like.

Examples of the water-soluble inorganic salt may include sodium chloride, potassium chloride, and the like. The wetting agent may make the black colorant such as the pigment to be uniformly mixed with the water-soluble inorganic salt uniformly and be pulverized. Examples of the wetting agent include alkylene glycol monoalkyl ethers such as ethylene glycol monoethylether, propylene glycol monomethylether, diethylene glycol monomethylether, and the like, and alcohols such as ethanol, isopropanol, butanol, hexanol, cyclohexanol, ethylene glycol, diethylene glycol, polyethylene glycol, glycerine polyethylene glycol, and the like. These may be used singularly or as a mixture of two or more.

For example, the black colorant such as the pigment may be used in a pigment dispersion liquid including the dispersing agent and an organic solvent, and the pigment dispersion liquid may include a solid pigment (black colorant), a dispersing agent, and an organic solvent.

The black colorant may be included in an amount of about 1 wt % to about 15 wt %, e.g., about 1 wt % to about 10 wt %, based on the total weight of the photosensitive resin composition. When the black colorant is included within the range, luminance, color reproducibility, curability of a pattern, heat resistance, and close-contacting force may be improved.

(E) Solvent

The solvent may be a material having compatibility with the pigment dispersion including the black colorant, the binder resin, the photopolymerizable monomer, and the photopolymerization initiator, but not reacting therewith.

Examples of the solvent may include alcohols such as methanol, ethanol, and the like; ethers such as dichloroethylether, n-butylether, diisoamylether, methylphenylether, tetrahydrofuran, and the like; glycol ethers such as ethylene glycolmonomethylether, ethylene glycolmonoethylether, ethylene glycoldimethylether, and the like; cellosolve acetates such as methyl cellosolve acetate, ethyl cellosolve acetate, diethyl cellosolve acetate, and the like; carbitols such as methylethylcarbitol, diethylcarbitol, diethylene glycolmonomethylether, diethylene glycolmonoethylether, diethylene glycoldimethylether, diethylene glycolethylmethylether, diethylene glycoldiethylether, and the like; propylene glycolalkylether acetates such as propylene glycolmethylether acetate, propylene glycolpropylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; oxy acetic acid alkyl esters such as oxy methyl acetate, oxy ethyl acetate, butyl oxyacetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy propionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxypropionic acid alkyl ester such as 2-methoxymethyl propionate, 2-methoxyethyl propionate, 2-ethoxyethyl propionate, 2-ethoxymethyl propionate, and the like; 2-oxy-2-methylpropionic acid esters such as 2-oxy-2-methylmethyl propionate, 2-oxy-2-methylethyl propionate and the like; monooxy monocarboxylic acid alkyl esters of 2-alkoxy-2-methyl alkyl propionates such as 2-methoxy-2-methylmethyl propionate, 2-ethoxy-2-methylethyl propionate, and the like; esters such as 2-hydroxyethyl propionate, 2-hydroxy-2-methylethyl propionate, ethyl hydroxyacetate, 2-hydroxy-3-methyl methyl butanoate, and the like; ketonate esters such as ethyl pyruvate, and the like. In an implementation, a high boiling point solvent such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like may be also used.

In an implementation, in consideration of miscibility and reactivity, glycol ethers such as ethylene glycol monoethylether, ethylene glycol dimethylether, ethylene glycol diethylether, diethylene glycol ethylmethyl ether, and the like; ethylene glycol alkylether acetates such as ethyl cellosolve acetate, and the like; esters such as 2-hydroxyethyl propionate, and the like; carbitols such as diethylene glycolmonomethylether, and the like; or propylene glycol alkylether acetates such as propylene glycolmonomethyl ether acetate, propylene glycolpropyletheracetate, and the like may be used.

In an implementation, the solvent may be included in a balance amount, in addition to any other components of the photosensitive resin composition. In an implementation, the solvent may be included in an amount of, e.g., about 50 wt % to about 90 wt %, based on the total weight of the photosensitive resin composition. When the solvent is included within the range, the photosensitive resin composition may have an appropriate viscosity resulting in improvement of coating characteristics of a black pixel defining layer.

(F) Other Additive

In an implementation, the photosensitive resin composition may further include an additive of malonic acid; 3-amino-1,2-propanediol; a silane-based coupling agent; a leveling agent; a fluorine-based surfactant; a radical polymerization initiator; or a combination thereof.

The silane-based coupling agent may have a reactive substituent of a vinyl group, a carboxyl group, a methacryloxy group, an isocyanate group, an epoxy group, and the like, in order to help improve close-contacting properties with a substrate.

Examples of the silane-based coupling agent may include trimethoxysilylbenzoic acid, γ-methacryloxypropyltrimethoxysilane, vinyltriacetoxysilane, vinyltrimethoxysilane, γ-isocyanatepropyltriethoxysilane, γ-glycidoxypropyltrimethoxysilane, β-(3,4-epoxycyclohexyl)ethyltrimethoxysilane, and the like. These may be used singularly or in a mixture of two or more.

The silane-based coupling agent may be included in an amount of about 0.01 parts by weight to about 10 parts by weight, based on 100 parts by weight of the photosensitive resin composition. When the silane-based coupling agent is included within the range, close-contacting properties, storage properties, and the like may be improved.

In an implementation, the photosensitive resin composition may further include a fluorine-based surfactant or a leveling agent in order to help improve coating properties and prevent a defect if necessary.

The fluorine-based surfactant or the leveling agent may be a commercial fluorine-based surfactant or a leveling agent such as BM-1000 ®, BM-1100®, and the like (BM Chemie Inc.); MEGAFACE F 142D®, F 172®, F 173®, F 183®, F 554®, and the like (Dainippon Ink Kagaku Kogyo Co., Ltd.); FULORAD FC-135°, FC-170C®, FC-430®, FC-431®, and the like (Sumitomo 3M Co., Ltd.); SURFLON S-112®, S-113®, S-131®, S-141®, S-145®, and the like (Asahi Glass Co., Ltd.); SH-28PA®, SH-190®, SH-193®, SZ-6032®, and SF-8428®, and the like (Toray Silicone Co., Ltd.).

In an implementation, the fluorine-based surfactant or the leveling agent may be included in an amount of about 0.001 to about 5 parts by weight, based on 100 parts by weight of the photosensitive resin composition. When the fluorine-based surfactant or the leveling agent is included within the range, excellent wetting on an IZO substrate or a glass substrate as well as coating uniformity may be secured, a stain may not be produced.

In an implementation, the photosensitive resin composition may include other additives such as an antioxidant, a stabilizer, and the like in a predetermined amount unless they deteriorate properties of the photosensitive resin composition.

Another embodiment provides a black pixel defining layer manufactured by exposure, development, and curing of the photosensitive resin composition.

A method of manufacturing the black pixel defining layer may be as follows.

(1) Coating and Film Formation

The photosensitive resin composition may be coated to have a desired thickness on a substrate, e.g., a glass substrate or a IZO substrate which undergoes a predetermined pretreatment, using, e.g., a spin or slit coating method, a roll coating method, a screen-printing method, an applicator method, or the like, and may be heated at about 70° C. to about 100° C. for 1 minute to 10 minutes to remove a solvent, forming a photosensitive resin layer.

(2) Exposure

The photosensitive resin layer may be patterned by disposing a mask and then, radiating an actinic ray ranging from about 200 nm to about 500 nm. The radiation may be performed by using a light source such as a mercury lamp with a low pressure, a high pressure, or an ultrahigh pressure, a metal halide lamp, an argon gas laser, and the like. An X ray, an electron beam, and the like may be also used.

The exposure process may use, e.g., a light dose of about 500 mJ/cm$^2$ or less (with a 365 nm sensor) when a high pressure mercury lamp is used. In an implementation, the light dose may vary depending on kinds of each component, its combination ratio, and a dry film thickness.

(3) Development

After the exposure process, an alkali aqueous solution may be used to develop the exposed film by dissolving and removing an unnecessary part except the exposed part, forming a pattern.

(4) Post-Treatment

The developed image pattern may be post-heated in order to accomplish excellent quality in terms of heat resistance, photo resistance, close contacting properties, crack-resistance, chemical resistance, high strength, storage stability, and the like. For example, after development, heat-treatment may be performed under a nitrogen atmosphere in a convection oven of about 250° C. for about 1 hour.

Another embodiment provides a display device including the black pixel defining layer.

The display device may be an organic light emitting diode (OLED).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Synthesis of Polyamic Acid-Polyimide Copolymer

Synthesis Example 1

Synthesis of Polyamic acid-polyimide Copolymer 1

86.6 g of N-methyl-2-pyrrolidone (NMP) was put in a four-necked flask equipped with an agitator, a temperature controller, a nitrogen gas-injector, and a cooler while nitrogen was passed, and 12.3 g of 4,4'-(hexafluoroisopropylidene)diphthalicanhydride (6-FDA) was added thereto and dissolved therein. When the solid was completely dissolved, 3.25 g of 3-aminophenyl sulfone (3-DAS) was added thereto, and the mixture was stirred at ambient temperature for 2 hours. The temperature was increased up to 90° C., 5.6 g of pyridine and 2.05 g of acetic anhydride (A$_2$CO) were added thereto, and the obtained mixture was stirred for 3 hours. The temperature in the reactor was cooled down to ambient temperature again, 1.6 g of 2-hydroethylmethacrylate (HEMA) was added thereto, and the mixture was stirred for 6 hours. Subsequently, 3.25 g of 3-aminophenyl sulfone (3-DAS) was added thereto, and after reacting the mixture for 6 hours, the reaction was completed. The reaction mixture was added to water to produce a precipitate, and the precipitate was filtered, sufficiently cleaned with water, and dried under a vacuum at 50° C. for 24 hours to obtain a polyamic acid-polyimide copolymer 1. A weight average molecular weight that is reduced to standard polystyrene through GPC (Gel Permeation Chromatography) of the copolymer was 7,500 g/mol, and its polydispersity was 1.75. (A mole ratio of a polyimide unit and a polyamic acid unit=50:50)

Synthesis Example 2

Synthesis of Polyamic acid-polyimide Copolymer 2

86.6 g of N-methyl-2-pyrrolidone (NMP) was put in a four-necked flask equipped with an agitator, a temperature controller, a nitrogen gas injector, and a cooler while nitrogen was passed, and 12.3 g of 4,4'-(hexafluoroisopropylidene)diphthalicanhydride (6-FDA) was added thereto and dissolved therein. When the solid was completely dissolved, 3.25 g of 3-aminophenyl sulfone (3-DAS) was added thereto, and the mixture was stirred at ambient temperature for 2 hours. Then, the temperature was increased up to 90°

C., 5.6 g of pyridine and 2.05 g of acetic anhydride (A₂CO) were added thereto, and the mixture was stirred for 3 hours. The temperature in the reactor was cooled down to ambient temperature again, 1.6 g of 2-hydroethylmethacrylate (HEMA) was added thereto, and the mixture was stirred for 6 hours. Then, 3.2 g of 4,4'-oxydianiline (ODA) was added thereto, and after reacting the obtained mixture for 6 hours, the reaction was completed. The reaction mixture was added to water to produce a precipitate; the precipitate was filtered, sufficiently cleaned with water, and dried at 50° C. under vacuum for 24 hours to obtain a polyamic acid-polyimide copolymer 2. A weight average molecular weight that is reduced to standard polystyrene through GPC of the copolymer was 6,800 g/mol, and its polydispersity was 1.82. (A mole ratio of a polyimide unit and a polyamic acid unit=50:50)

Synthesis Example 3

Synthesis of Polyamic acid-polyimide Copolymer 3

86.6 g of N-methyl-2-pyrrolidone (NMP) was put in a four-necked flask equipped with an agitator, a temperature controller, a nitrogen gas injector, and a cooler while nitrogen was passed, and 12.3 g of 4,4'-(hexafluoroisopropylidene)diphthalicanhydride (6-FDA) was added thereto and dissolved therein. When the solid was completely dissolved, 3.25 g of 4,4'-oxydianiline (ODA) was added thereto, and the mixture was stirred at ambient temperature for 2 hours. The temperature was increased up to 90° C., 5.6 g of pyridine, 2.05 g of acetic anhydride (A₂CO) were added thereto, and the obtained mixture was stirred for 3 hours. The temperature in the reactor was cooled down to ambient temperature, 1.6 g of 2-hydroethylmethacrylate (HEMA) was added thereto, and the mixture was stirred for 6 hours. Subsequently, after adding 3.25 g of 3-aminophenyl sulfone (3-DAS) thereto and reacting the mixture for 6 hours, the reaction was completed. The reaction mixture was added to water to produce a precipitate, and the precipitate was filtered, sufficiently cleaned with water, and dried at 50° C. under vacuum for 24 hours to obtain a polyamic acid-polyimide copolymer 3. A weight average molecular weight that is reduced to standard polystyrene through GPC of the copolymer was 7,200 g/mol, and its polydispersity was 1.80. (A mole ratio of a polyimide unit and a polyamic acid unit=50:50)

Synthesis Example 4

Synthesis of Polyamic acid-polyimide Copolymer 4

86.6 g of N-methyl-2-pyrrolidone (NMP) was put in a four-necked flask equipped with an agitator, a temperature controller, an nitrogen gas injector, and a cooler while nitrogen was passed, 12.3 g of 4,4'-(hexafluoroisopropylidene)diphthalicanhydride (6-FDA) was added thereto and dissolved therein. When the solid was completely dissolved, 2.6 g of 3-aminophenyl sulfone (3-DAS) was added thereto, and the mixture was stirred at ambient temperature for 2 hours. The temperature was increased up to 90° C., 5.6 g of pyridine and 2.05 g of acetic anhydride (A₂CO) were added thereto, and the mixture was stirred for 3 hours. The temperature in the reactor was cooled down to ambient temperature again, 1.6 g of 2-hydroethylmethacrylate (HEMA) was added thereto, and the mixture was stirred for 6 hours. Then, 3.9 g of 3-aminophenyl sulfone (3-DAS) was added thereto, and after reacting the mixture for 6 hours, the reaction was completed. The reaction mixture was added to water to produce a precipitate, and the precipitate was filtered, sufficiently cleansed with water, and dried at 50° C. under a vacuum condition for 24 hours to obtain a polyamic acid-polyimide copolymer 4. A weight average molecular weight that is reduced to standard polystyrene through GPC of the copolymer was 6,700 g/mol, and its polydispersity was 1.73. (A mole ratio of a polyimide unit and a polyamic acid unit=40:60)

Synthesis of Polyimide Resin

Synthesis Example 5

Synthesis of Polyimide Resin 86.6 g of N-methyl-2-pyrrolidone (NMP) was put in a four-necked flask equipped with an agitator, a temperature controller, an nitrogen gas injector, and a cooler while nitrogen was passed, and 12.3 g of 4,4'-(hexafluoroisopropylidene)diphthalicanhydride (6-FDA) was added thereto and dissolved therein. When the solid was completely dissolved, 6.5 g of 3-aminophenyl sulfone (3-DAS) was added thereto, and the mixture was stirred at ambient temperature for 2 hours. Then, the temperature was increased up to 90° C., 11.2 g of pyridine, 4.05 g of acetic anhydride (A₂CO) were added thereto, and after reacting the mixture for 3 hours, the reaction was completed. The reaction mixture was added to water to produce a precipitate, and the precipitate was filtered, sufficiently cleaned with water, and dried at 50° C. under a vacuum condition for greater than or equal to 24 hours to prepare a polyimide resin. A weight average molecular weight that is reduced to standard polystyrene through GPC of the resin was 7,800 g/mol, and its polydispersity was 1.8.

Synthesis of Polyamic Acid Resin

Synthesis Example 6

Synthesis of Polyamic Acid Resin 86.6 g of N-methyl-2-pyrrolidone (NMP) was put in a four-necked flask equipped with an agitator, a temperature controller, an nitrogen gas injector, and a cooler while nitrogen was passed, and 12.3 g of 4,4'-(hexafluoroisopropylidene)diphthalicanhydride (6-FDA) was added thereto and dissolved therein. When the solid was completely dissolved, 6.5 g of 3-aminophenyl sulfone (3-DAS) was added thereto, and after stirring the mixture at ambient temperature for 2 hours, the reaction was completed. The mixture was added to water to produce a precipitate, and the precipitate was filtered, sufficiently cleaned with water, and dried at 50° C. under a vacuum condition for 24 hours to obtain a polyamic acid resin. A weight average molecular weight that is reduced to standard polystyrene through GPC of the resin was 7,500 g/mol, and its polydispersity was 2.1.

Synthesis of Mixture of Polyimide Resin and Polyamic Acid Resin

Synthesis Example 7

Synthesis of Resin Mixture

The polyimide resin of Synthesis Example 5 and the polyamic acid resin of Synthesis Example 6 were mixed in a ratio of 1:1 part by weight to prepare a resin mixture of polyimide and polyamic acid (a resin mixture). A weight average molecular weight that is reduced to standard polystyrene through GPC of the resin mixture was 7,600 g/mol, and its polydispersity was 1.95.

Preparation of Photosensitive Resin Composition

Examples 1 to 18 and Comparative Examples 1 to 9

Photosensitive resin compositions according to Examples 1 to 18 and Comparative Examples 1 to 9 were prepared to have each composition by using the following components shown in Tables 1 to 3.

Specifically, a content of a photopolymerization initiator was precisely measured, a solvent was added thereto, and the mixture was stirred until the photopolymerization initiator was completely dissolved (greater than or equal to 30 minutes). Then, a binder resin and a photopolymerizable monomer were sequentially added thereto, and the obtained mixture was stirred again for about one hour. Subsequently, a colorant (a pigment dispersion) and other additives were added thereto, and the entire composition was finally stirred for greater than or equal to 2 hours to prepare a photosensitive resin composition.

Each component used in the photosensitive resin composition is as follows.

(A) Binder Resin
(A-1) The polyamic acid-polyimide copolymer prepared in Synthesis Example 1
(A-2) The polyamic acid-polyimide copolymer prepared in Synthesis Example 2
(A-3) The polyamic acid-polyimide copolymer prepared in Synthesis Example 3
(A-4) The polyamic acid-polyimide copolymer prepared in Synthesis Example 4
(A-5) The polyimide resin prepared in Synthesis Example 5
(A-6) The polyamic acid resin prepared in Synthesis Example 6
(A-7) The resin mixture of polyimide and polyamic acid prepared in Synthesis Example 7
(A-8) Cardo-based binder resin (V259ME, NSSC (Nippon Steel & Sumikin Chemical) Co., Ltd.)
(A-9) Acryl-based binder resin (KBR-101, Kyung-In Corporation)
(B) Photopolymerizable Monomer
Dipentaerythritol hexa(meth)acrylate (DPHA, Sartomer)
(C) Photopolymerization Initiator
(C-1) First Photopolymerization Initiator (IRG-819, CIBA)
(C-2) Second Photopolymerization Initiator (NCI-831, ADEKA)
(C-3) Second Photopolymerization Initiator (PBG-304, TRONYL)
(C-4) Second Photopolymerization Initiator (PBG-305, TRONYL)
(C-5) Second Photopolymerization Initiator (IRG-369, CIBA)
(C-6) Second Photopolymerization Initiator (IRG-907, CIBA)
(C-7) Second Photopolymerization Initiator (IRGACURE OXE01, BASF)
(C-8) Second Photopolymerization Initiator (IRGACURE OXE02, BASF)
(D) Black Colorant
(D-1) Organic Black Pigment (CIM-126) Dispersion (SAKATA Corp.)
(D-2) Carbon Black Mill Base (BK-6925) Dispersion (TOKUSIKI Co., Ltd.)
(E) Solvent
(E-1) Propylene glycol monomethylether acetate (PGMEA, Sigma-Aldrich Corp.)
(E-2) Ethylene glycol dimethyl ether (EDM, Sigma-Aldrich Corp.)
(F) Other Additives
(F-1) Leveling Agent (F-554 (10% diluted solution), DIC Co., Ltd.)
(F-2) Coupling Agent (S-710, Chisso Corp.)

TABLE 1

(unit: g)

|  |  | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|
| (A) Binder resin | A-1 | 1.5 | 1.5 | 1.5 | 1.5 | 1.5 | 1.5 | 1.5 | 1.5 | 1.5 |
|  | A-2 | — | — | — | — | — | — | — | — | — |
|  | A-3 | — | — | — | — | — | — | — | — | — |
|  | A-4 | — | — | — | — | — | — | — | — | — |
|  | A-5 | — | — | — | — | — | — | — | — | — |
|  | A-6 | — | — | — | — | — | — | — | — | — |
|  | A-7 | — | — | — | — | — | — | — | — | — |
|  | A-8 | 3.0 | 3.0 | 3.0 | 3.0 | 3.0 | 3.0 | 3.0 | 3.0 | 3.0 |
|  | A-9 | — | — | — | — | — | — | — | — | — |
| (B) Photopolymerizable monomer |  | 6.8 | 6.8 | 6.8 | 6.8 | 6.8 | 6.8 | 6.8 | 6.8 | 6.8 |
| (C) Photopolymerization initiator | C-1 | 0.5 | 0.5 | 0.5 | 0.5 | 0.5 | 0.5 | 0.5 | 0.4 | 0.6 |
|  | C-2 | 0.5 | — | — | — | — | — | — | 0.6 | 0.4 |
|  | C-3 | — | 0.5 | — | — | — | — | — | — | — |
|  | C-4 | — | — | 0.5 | — | — | — | — | — | — |
|  | C-5 | — | — | — | 0.5 | — | — | — | — | — |
|  | C-6 | — | — | — | — | 0.5 | — | — | — | — |
|  | C-7 | — | — | — | — | — | 0.5 | — | — | — |
|  | C-8 | — | — | — | — | — | — | 0.5 | — | — |
| (D) Colorant | D-1 | 3.2 | 3.2 | 3.2 | 3.2 | 3.2 | 3.2 | 3.2 | 3.2 | 3.2 |
|  | D-2 | 0.5 | 0.5 | 0.5 | 0.5 | 0.5 | 0.5 | 0.5 | 0.5 | 0.5 |

TABLE 1-continued (unit: g)

|  |  | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|
| (E) Solvent | E-1 | 67.0 | 67.0 | 67.0 | 67.0 | 67.0 | 67.0 | 67.0 | 67.0 | 67.0 |
|  | E-2 | 17.0 | 17.0 | 17.0 | 17.0 | 17.0 | 17.0 | 17.0 | 17.0 | 17.0 |
| (F) Other additives | F-1 | 0.02 | 0.02 | 0.02 | 0.02 | 0.02 | 0.02 | 0.02 | 0.02 | 0.02 |
|  | F-2 | 0.037 | 0.037 | 0.037 | 0.037 | 0.037 | 0.037 | 0.037 | 0.037 | 0.037 |

TABLE 2

(unit: g)

|  |  | Ex. 10 | Ex. 11 | Ex. 12 | Ex. 13 | Ex. 14 | Ex. 15 | Ex. 16 | Ex. 17 | Ex. 18 |
|---|---|---|---|---|---|---|---|---|---|---|
| (A) Binder resin | A-1 | 1.5 | 1.5 | 1.5 | 1.5 | 1.5 | 1.5 | 1.5 | 1.5 | 1.5 |
|  | A-2 | — | — | — | 3.0 | — | — | — | — | — |
|  | A-3 | — | — | — | — | 3.0 | — | — | — | — |
|  | A-4 | — | — | — | — | — | 3.0 | — | — | — |
|  | A-5 | — | — | — | — | — | — | 3.0 | — | — |
|  | A-6 | — | — | — | — | — | — | — | 3.0 | — |
|  | A-7 | — | — | — | — | — | — | — | — | 3.0 |
|  | A-8 | 3.0 | 3.0 | — | — | — | — | — | — | — |
|  | A-9 | — | — | 3.0 | — | — | — | — | — | — |
| (B) Photopolymerizable monomer |  | 6.8 | 6.8 | 6.8 | 6.8 | 6.8 | 6.8 | 6.8 | 6.8 | 6.8 |
| (C) Photopolymerization initiator | C-1 | 0.3 | 0.7 | 0.5 | 0.5 | 0.5 | 0.5 | 0.5 | 0.5 | 0.5 |
|  | C-2 | 0.7 | 0.3 | 0.5 | 0.5 | 0.5 | 0.5 | 0.5 | 0.5 | 0.5 |
|  | C-3 | — | — | — | — | — | — | — | — | — |
|  | C-4 | — | — | — | — | — | — | — | — | — |
|  | C-5 | — | — | — | — | — | — | — | — | — |
|  | C-6 | — | — | — | — | — | — | — | — | — |
|  | C-7 | — | — | — | — | — | — | — | — | — |
|  | C-8 | — | — | — | — | — | — | — | — | — |
| (D) Colorant | D-1 | 3.2 | 3.2 | 3.2 | 3.2 | 3.2 | 3.2 | 3.2 | 3.2 | 3.2 |
|  | D-2 | 0.5 | 0.5 | 0.5 | 0.5 | 0.5 | 0.5 | 0.5 | 0.5 | 0.5 |
| (E) Solvent | E-1 | 67.0 | 67.0 | 67.0 | 67.0 | 67.0 | 67.0 | 67.0 | 67.0 | 67.0 |
|  | E-2 | 17.0 | 17.0 | 17.0 | 17.0 | 17.0 | 17.0 | 17.0 | 17.0 | 17.0 |
| (F) Other additives | F-1 | 0.02 | 0.02 | 0.02 | 0.02 | 0.02 | 0.02 | 0.02 | 0.02 | 0.02 |
|  | F-2 | 0.037 | 0.037 | 0.037 | 0.037 | 0.037 | 0.037 | 0.037 | 0.037 | 0.037 |

TABLE 3

(unit: g)

|  |  | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 |
|---|---|---|---|---|---|---|---|---|---|---|
| (A) Binder resin | A-1 | 1.5 | 1.5 | 1.5 | 1.5 | 1.5 | 1.5 | 1.5 | 1.5 | 1.5 |
|  | A-2 | — | — | — | — | — | — | — | — | — |
|  | A-3 | — | — | — | — | — | — | — | — | — |
|  | A-4 | — | — | — | — | — | — | — | — | — |
|  | A-5 | — | — | — | — | — | — | — | — | — |
|  | A-6 | — | — | — | — | — | — | — | — | — |
|  | A-7 | — | — | — | — | — | — | — | — | — |
|  | A-8 | 3.0 | 3.0 | 3.0 | 3.0 | 3.0 | 3.0 | 3.0 | 3.0 | 3.0 |
|  | A-9 | — | — | — | — | — | — | — | — | — |
| (B) Photopolymerizable monomer |  | 6.8 | 6.8 | 6.8 | 6.8 | 6.8 | 6.8 | 6.8 | 6.8 | 6.8 |
| (C) Photopolymerization initiator | C-1 | 1.0 | — | — | — | — | — | — | 0.2 | 0.8 |
|  | C-2 | — | 1.0 | — | — | — | — | — | 0.8 | 0.2 |
|  | C-3 | — | — | 1.0 | — | — | — | — | — | — |
|  | C-4 | — | — | — | 1.0 | — | — | — | — | — |
|  | C-5 | — | — | — | — | 1.0 | — | — | — | — |
|  | C-6 | — | — | — | — | — | 1.0 | — | — | — |
|  | C-7 | — | — | — | — | — | — | 1.0 | — | — |
|  | C-8 | — | — | — | — | — | — | — | — | — |
| (D) Colorant | D-1 | 3.2 | 3.2 | 3.2 | 3.2 | 3.2 | 3.2 | 3.2 | 3.2 | 3.2 |
|  | D-2 | 0.5 | 0.5 | 0.5 | 0.5 | 0.5 | 0.5 | 0.5 | 0.5 | 0.5 |
| (E) Solvent | E-1 | 67.0 | 67.0 | 67.0 | 67.0 | 67.0 | 67.0 | 67.0 | 67.0 | 67.0 |
|  | E-2 | 17.0 | 17.0 | 17.0 | 17.0 | 17.0 | 17.0 | 17.0 | 17.0 | 17.0 |

TABLE 3-continued (unit: g)

|  |  | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 |
|---|---|---|---|---|---|---|---|---|---|---|
| (F) Other additive | F-1 | 0.02 | 0.02 | 0.02 | 0.02 | 0.02 | 0.02 | 0.02 | 0.02 | 0.02 |
|  | F-2 | 0.037 | 0.037 | 0.037 | 0.037 | 0.037 | 0.037 | 0.037 | 0.037 | 0.037 |

(Evaluation)

Sensitivity

The photosensitive resin compositions according to Examples 1 to 18 and Comparative Examples 1 to 9 were respectively coated on a 10 cm*10 cm ITO glass (resistance 30Ω) and then, proxy type-heated on a 100° C. hot plate for 1 minute and contact type-heated for 1 minute again to respectively form 1.2 μm-thick photosensitive resin layers. The substrates respectively coated with the photosensitive resin layers were exposed to light by using a mask having variously-sized patterns and changing a light dose with UX-1200SM-AKS02 (Ushio Inc.), developed at room temperature in a 2.38% TMAH solution to dissolve and remove the exposed region, and cleaned with pure water for 50 seconds to form each pattern.

Sensitivity was evaluated by measuring energy realizing a 20 μm pattern with a reference to a size of a 20 μm square pattern measured by using MX51T-N633MU made by Olympus Corp., and the results are shown in Tables 4 to 6.

Taper Angle

The photosensitive resin composition according to Examples 1 to 18 and Comparative Examples 1 to 9 were respectively coated to have a predetermined thickness on a glass substrate in a method of spin-coating, slit-coating, roll-coating, screen-printing, an applicator, and the like depending a coating machine (MIKASA Co., Ltd.), heated on a hot plate at 70° C. to 100° C. for 1 minute to 10 minutes (dried) to remove solvents and obtain films. The films were exposed by using an exposer (HB-50110AA, Ushio Inc.) and a halftone mask with an exposure dose of 50 mj/cm². Subsequently, the films were developed in a 2.38% TMAH aqueous solution for 150 seconds with a developer (SSP-200, SVS Corp.) and hard-baked (or post-baked) in an oven at 230° C. for 30 minutes to obtain patterned photosensitive resin film specimens. As for the patterned specimens, their taper angles were measured by using a scanning electron microscope (SEM), and the results are shown in Tables 4 to 6 and FIGS. 1 and 2.

TABLE 4

|  | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|
| Sensitivity (mJ/cm²) | 100 | 150 | 220 | 300 | 320 | 140 | 200 | 80 | 140 |
| Taper angle (°) | <45 | <45 | <40 | <40 | <35 | <50 | <40 | <50 | <40 |

TABLE 5

|  | Ex. 10 | Ex. 11 | Ex. 12 | Ex. 13 | Ex. 14 | Ex. 15 | Ex. 16 | Ex. 17 | Ex. 18 |
|---|---|---|---|---|---|---|---|---|---|
| Sensitivity (mJ/cm²) | 70 | 200 | 140 | 140 | 180 | 160 | 230 | 190 | 140 |
| Taper angle (°) | >50 | <35 | <50 | <50 | <50 | <50 | >50 | >50 | <50 |

TABLE 6

|  | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 |
|---|---|---|---|---|---|---|---|---|---|
| Sensitivity (mJ/cm²) | 280 | 60 | 140 | 180 | 200 | 240 | 120 | 65 | 170 |
| Taper angle (°) | <30 | >50 | >50 | <35 | <35 | <35 | >50 | >50 | <40 |

Figure 2:
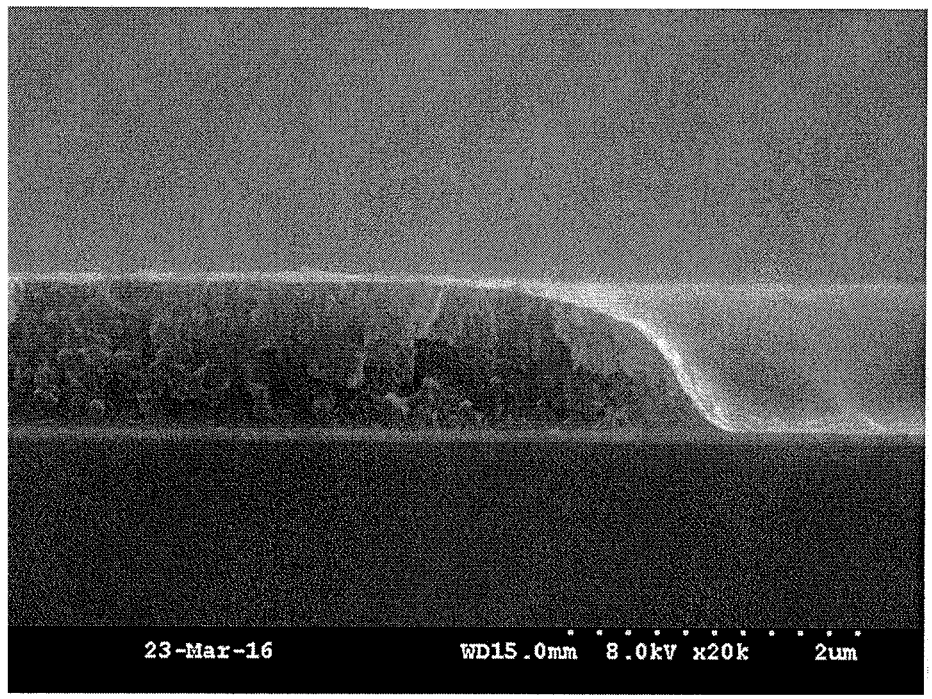
FIG. 2 illustrates a scanning electron microscope (SEM) image of a cross-section of a black pixel defining layer manufactured using the photosensitive resin composition according to Example 2.

Referring to Tables 4 to 6 and FIGS. 1 and 2, when a long wavelength initiator such as IRG-819 and the like was used alone, excellent taper characteristics were obtained, but sensitivity was deteriorated, but when a high sensitivity initiator such as NCI-831, PBG-304 or the like was used alone, excellent sensitivity was obtained, but taper characteristics were deteriorated. For example, the high sensitivity initiator was fast surface-cured due to its own characteristics but not deeply cured and thus deteriorated a melting flow, and a photosensitive resin composition including a black colorant may have a curing difference on top and at the bottom. On the contrary, the photosensitive resin composition according to the Examples included both of the long wavelength initiator and the high sensitivity initiator, and excellent taper characteristics and sensitivity were obtained. For example, when the two initiators were used in a ratio of 3:7 to 7:3, excellent taper characteristics and sensitivity were obtained. When the two initiators were used in a ratio of 2:8 or 8:2, both taper characteristics and sensitivity were all deteriorated, and accordingly, the ratio of the two initiators was an important factor.

By way of summation and review, a barrier rib material and a planarization layer of a light emitting device may use an organic material having transparency or transmittance near to the transparency, and an external light reflection that external light is reflected by a metal layer may occur and thus hinder the organic light emitting diode (OLED) from realizing real black and deteriorate its contrast ratio and low outdoor visibility.

Accordingly, various attempts and efforts to improve the external light reflection have been considered, such as a method of coating a light-absorbing material on the surface of the electrode, e.g., applying a black electrode has been suggested but may cause issues in terms of processability and reliability. In addition, a method of using a one-polarizing plate in order to reduce the external light reflection and thus increase the outdoor visibility has been considered and became commercially available but, may require supply of a higher current in order to maintain luminance, since the luminance may decrease whenever even light from the organic light emitting diode (OLED) passes a polarizer, and resultantly, may deteriorate a life-span of the organic light emitting diode (OLED). Furthermore, various attempts such as a method of applying an antireflection layer to decrease the external light reflection and improve the contrast have been made, but the external light reflection still remains and may be more serious as for a large-scaled display.

Accordingly, research on developing a photosensitive resin composition capable of addressing the above-described issues has been made.

The embodiments may provide a photosensitive resin composition capable of providing improved sensitivity and low taper.

A photosensitive resin composition according to an embodiment may help block external light reflection and thereby help improve a contrast ratio and visibility. In addition, after the photosensitive resin composition is coated, a lower layer under coating as well as an upper layer over the coating may be sufficiently cured and thereby developability, pattern characteristics, and process margin are improved and improved sensitivity and low taper may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A photosensitive resin composition for a black pixel defining layer, comprising:
about 1 wt % to about 15 wt % of a binder resin, the binder resin including a polyamic acid-polyimide copolymer that includes a polyamic acid repeating unit and a polyimide repeating unit in a mole ratio of the polyamic acid repeating unit to the polyimide repeating unit of about 5:5 to about 9:1;
about 1 wt % to about 15 wt % of a photopolymerizable monomer;
about 0.1 wt % to about 5 wt % of a photopolymerization initiator, the photopolymerization initiator including a first photopolymerization initiator and a second photopolymerization initiator;
about 1 wt % to about 15 wt % of a black colorant; and
about 50 wt % to about 90 wt % of a solvent,
wherein:
all wt % are based on a total weight of the photosensitive resin composition for a black pixel defining layer,
the first photopolymerization initiator is represented by Chemical Formula 1,
the second photopolymerization initiator is represented by one of Chemical Formula 2, Chemical Formula 3, Chemical Formula 4, or Chemical Formula 6, and
the first photopolymerization initiator and the second photopolymerization initiator are included in a weight ratio of about 3:7 to about 7:3,

[Chemical Formula 1]

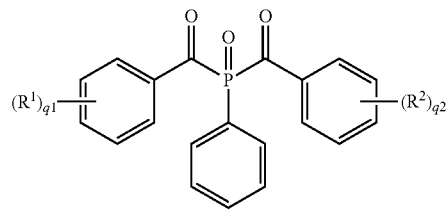

wherein, in Chemical Formula 1,
$R^1$ and $R^2$ are each independently a hydrogen atom, a substituted or unsubstituted C1 to C20 alkyl group, a substituted or unsubstituted C1 to C20 alkoxy group, or a substituted or unsubstituted C6 to C20 aryl group, and
q1 and q2 are each independently an integer of 0 to 5,

[Chemical Formula 2]

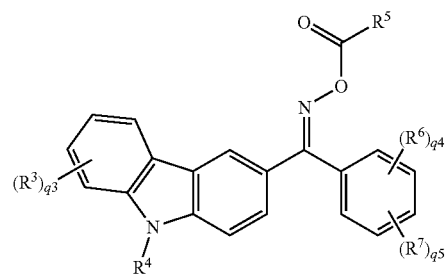

wherein, in Chemical Formula 2,
$R^3$ is a nitro group,
$R^4$ and $R^5$ are each independently a substituted or unsubstituted C1 to C10 alkyl group or a substituted or unsubstituted C1 to C10 alkoxy group,
$R^6$ is a substituted or unsubstituted C1 to C10 alkyl group,
$R^7$ is a substituted or unsubstituted C1 to C10 alkoxy group, and
q3, q4, and q5 are each independently an integer of 0 to 5, and 1≤q4+q5≤5,

[Chemical Formula 3]

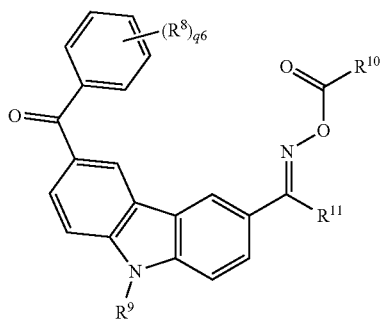

wherein, in Chemical Formula 3,
$R^8$ to $R^{10}$ are each independently a substituted or unsubstituted C1 to C10 alkyl group or a substituted or unsubstituted C1 to C10 alkoxy group,
$R^{11}$ is a substituted or unsubstituted C1 to C10 alkyl group, and
q6 is an integer of 0 to 5,

[Chemical Formula 4]

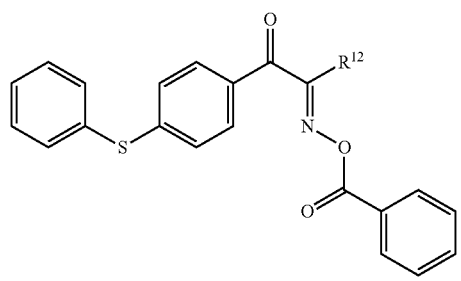

wherein, in Chemical Formula 4, $R^{12}$ is a substituted or unsubstituted C1 to C10 alkyl group or a substituted or unsubstituted C3 to C10 cycloalkyl group,

[Chemical Formula 6]

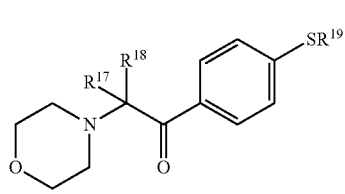

wherein, in Chemical Formula 6, $R^{17}$ to $R^{19}$ are each independently a substituted or unsubstituted C1 to C10 alkyl group.

2. The photosensitive resin composition for a black pixel defining layer as claimed in claim 1, wherein the first photopolymerization initiator and the second photopolymerization initiator are included in a weight ratio of about 4:6 to about 6:4.

3. The photosensitive resin composition for a black pixel defining layer as claimed in claim 1, wherein the first photopolymerization initiator has maximum absorbance in a wavelength region of about 270 nm to about 300 nm or about 390 nm to about 450 nm.

4. The photosensitive resin composition for a black pixel defining layer as claimed in claim 1, wherein the binder resin further includes one of a cardo-based binder resin and an acryl-based binder resin.

5. The photosensitive resin composition for a black pixel defining layer as claimed in claim 1, wherein the polyamic acid-polyimide copolymer has a weight average molecular weight of about 5,000 g/mol to about 20,000 g/mol.

6. The photosensitive resin composition for a black pixel defining layer as claimed in claim 1, wherein the black colorant includes an organic black pigment and an inorganic black pigment.

7. The photosensitive resin composition for a black pixel defining layer as claimed in claim 6, wherein the organic black pigment is included in an amount of about 5 parts by weight to about 10 parts by weight relative to 1 part by weight of the inorganic black pigment.

8. A black pixel defining layer manufactured using the photosensitive resin composition for a black pixel defining layer as claimed in claim 1.

9. A display device including the black pixel defining layer as claimed in claim 8.

10. The display device as claimed in claim 9, wherein the display device is an organic light emitting diode (OLED).

11. The photosensitive resin composition for a black pixel defining layer as claimed in claim 1, wherein the mole ratio of the polyamic acid repeating unit to the polyimide repeating unit is 6:4 to 9:1.

* * * * *